8/20/85 XR 4,536,673 SR

United States Patent [19]

Forster

[11] Patent Number: 4,536,673

[45] Date of Patent: Aug. 20, 1985

[54] PIEZOELECTRIC ULTRASONIC CONVERTER WITH POLYURETHANE FOAM DAMPER

[75] Inventor: Alfred Forster, Schwandorf, Fed. Rep. of Germany

[73] Assignee: Siemens Aktiengesellschaft, Berlin and Munich, Fed. Rep. of Germany

[21] Appl. No.: 569,132

[22] Filed: Jan. 9, 1984

[51] Int. Cl.³ .......... H01L 41/08

[52] U.S. Cl. .......... 310/327; 310/324; 310/334; 310/336; 310/345; 73/644

[58] Field of Search .......... 310/327, 334, 336, 337, 310/345, 326, 324; 73/632, 644; 367/162, 165; 179/110 A

[56] References Cited

U.S. PATENT DOCUMENTS

| | | | |
|---|---|---|---|
| 3,239,696 | 3/1966 | Burkhalter et al. | 310/327 |
| 3,950,660 | 4/1976 | McElroy | 310/327 X |
| 3,969,927 | 7/1976 | Yoshida et al. | 310/327 X |
| 4,079,362 | 3/1978 | Grimm et al. | 310/345 X |
| 4,081,889 | 4/1978 | Levine | 310/327 X |
| 4,326,274 | 4/1982 | Hotta et al. | 367/118 |

FOREIGN PATENT DOCUMENTS

| | | |
|---|---|---|
| 2656068 | 6/1977 | Fed. Rep. of Germany . |
| 1530347 | 9/1976 | United Kingdom . |

OTHER PUBLICATIONS

*Ultrasonic Engineering*, by Julian R. Frederick, John Wiley & Sons, Inc., N.Y., 1965, pp. 261, 262.

*Primary Examiner*—Mark O. Budd

*Attorney, Agent, or Firm*—F. W. Powers; J. L. James

[57] ABSTRACT

The invention relates to an ultrasonic converter with a plate type ceramic oscillator in which metal electrodes are fastened to the oscillator. At one end face of the ceramic oscillator an adaptation layer of plastic is present. The entire ultrasonic oscillator, except for the side of the adaptation layer facing the medium to be insonated, is provided with a foam covering, to reduce decay damping without a substantial loss in the transmission factor.

3 Claims, 1 Drawing Figure

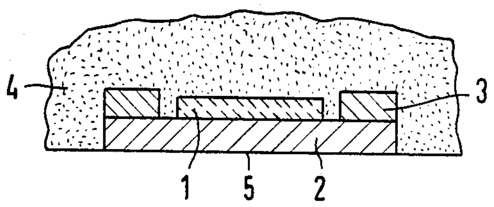
4
3
1
5
2

PIEZOELECTRIC ULTRASONIC CONVERTER WITH POLYURETHANE FOAM DAMPER

BACKGROUND OF THE INVENTION

The invention generally relates to an ultrasonic converter with a plate type ceramic oscillator to which metal electrodes are fastened and on one end face of which an adaptation layer of plastic is provided.

SUMMARY OF THE INVENTION

It is an object of the present invention to improve the decay attenuation—which is the attenuation of the mechanical oscillations of the converter immediately after transmitting—in existing ultrasonic converters without causing substantial deterioration in further transmission behavior. A typical ultrasonic converter is shown in Great Britain Pat. No. 1,530,347.

Existing methods of providing decay attenuation involve embedding the converters in rubber housings or in silicon or silicone sealing compounds, or providing electrical measures such as damping resistors or transistors. However, these methods do not yield sufficient decay attenuation, and in addition, they cause considerable reduction of the transmission factor which is the ratio of the transmitting signal to the receiving signal.

The present invention solves the above problem in a simple manner by providing a foam covering for the entire ultrasonic converter except for the side of the adapter layer facing the medium to be insonated. Polyurethane foam has proven to be an especially advantageous covering material, which allows decay attenuations greater than 20 dB to be achieved with a transmission factor loss of less than 3 dB. This makes it possible to substantially reduce the minimum distance between the converter and the object to be measured, without any great loss of attainable maximum spacing. In addition, it is advantageous to keep the radiation angle relatively small by surrounding the ceramic oscillator by a weighting ring. The advantage of keeping the radiation angle small is discussed in German Pat. No. 25 41 492.

In general, the invention features an ultrasonic converter with a plate type ceramic oscillator to which metal electrodes are fastened and on one end face of which an adaptation layer of plastic is provided, wherein the entire ultrasonic converter is covered with a foam covering, except for the side of the adaptation layer facing the medium to be insonated.

In preferred embodiments of the ultrasonic converter the foam covering is polyurethane foam; the ceramic oscillator is surrounded by a weighting ring; and the weighting ring is aluminum.

Other features and advantages of the present invention will become apparent from the following detailed description, and from the claims.

For a full understanding of the present invention, reference should now be made to the following detailed description and to the accompanying drawings.

BRIEF DESCRIPTION OF THE DRAWING

The single FIGURE shows a preferred embodiment of the invention.

DETAILED DESCRIPTION

The ultrasonic converter shown in the drawing includes ceramic oscillator 1, adaptation layer 2, to which corresponds the λ/4 layer, and aluminum weighting ring 3. The external dimensions of weighting ring 3 are coextensive with adaptation layer 2. The ceramic oscillator lies in the interior of weighting ring 3 without touching it. Adaptation layer 2 may consist of a mixture of polysterene lacquer and hollow balls of silicon dioxide. The exact construction of method of producing the adaptation layer are explained in detail in Great Britain Pat. No. 1,530,347 and German Pat. No. 25 41 492. According to the invention, the ultrasonic converter is surrounded by foam covering 4, but area 5 of the adaptation layer remains free from foam covering 4. Because only the outer shell and one side of the ultrasonic converter are provided with the foam covering the emergence of sound is not adversely affected. However, as already mentioned, good decay damping can be obtained in a simple manner because the foam covering, if made for example of polyurethane foam, can be used at the same time as housing attachment means.

There has thus been shown and described a novel ultrasonic converter which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modification, variations and other uses and applications which do not depart from the spirit and scope of the invention are deemed to be covered by the invention which is limited only by the claims which follow.

I claim:

1. In an ultrasonic converter with a disk-shaped ceramic oscillator, to which metal electrodes are fastened, having one face of said disk-shaped ceramic oscillator provided with a plastic adaption layer which is one quarter wavelength, λ/4, thick relative to the converter frequency and the characteristic sound propagation velocity of the adaption layer plastic material, and said disk-shaped ceramic oscillator being surrounded by a weight ring, the improvement comprising, providing the entire ultrasonic converter, except for said adaption layer facing the medium to be insonated, with a foam covering of polyurethane foam.

2. An ultrasonic converter according to claim 1, wherein said weighting ring is made of aluminum.

3. An ultrasonic converter according to claim 2, wherein the medium in which the ultrasonic converter propagates acoustic waves is air.

* * * * *